United States Patent
Lopez et al.

(10) Patent No.: US 9,171,809 B2
(45) Date of Patent: Oct. 27, 2015

(54) ESCAPE ROUTES

(71) Applicant: Flextronics AP, LLC, Broomfield, CO (US)

(72) Inventors: Omar Garcia Lopez, Jalisco (MX); Pedro Alejandro Ahumada Quintero, Jalisco (MX); Enrique Avelar Secada, Jalisco (MX); Murad Kurwa, San Jose, CA (US); Juan Carlos Gonzalez, Jal (MX)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/198,399

(22) Filed: Mar. 5, 2014

(65) Prior Publication Data

US 2014/0312479 A1    Oct. 23, 2014

Related U.S. Application Data (60) Provisional application No. 61/772,978, filed on Mar. 5, 2013.

(51) Int. Cl.
| | |
|---|---|
| *H01L 23/495* | (2006.01) |
| *H01L 21/50* | (2006.01) |
| *H01L 21/48* | (2006.01) |
| *H01L 23/00* | (2006.01) |
| *H05K 3/34* | (2006.01) |
| *H01L 23/31* | (2006.01) |

(52) U.S. Cl.
CPC .............. *H01L 23/562* (2013.01); *H01L 24/83* (2013.01); *H05K 3/3436* (2013.01); *H05K 3/3452* (2013.01); *H01L 23/3107* (2013.01); *H01L 2224/26122* (2013.01); *H01L 2224/291* (2013.01); *H01L 2224/83815* (2013.01); *H01L 2924/1011* (2013.01); *H01L 2924/15151* (2013.01); *H05K 2201/09036* (2013.01); *H05K 2201/10969* (2013.01); *H05K 2203/1178* (2013.01)

(58) Field of Classification Search
CPC ........................................................ H01L 23/562
USPC ........................................... 257/669; 438/106
See application file for complete search history.

(56) References Cited

U.S. PATENT DOCUMENTS

| | | | |
|---|---|---|---|
| 4,069,497 | A | 1/1978 | Steidlitz |
| 4,712,160 | A | 12/1987 | Sato et al. |
| 4,899,256 | A | 2/1990 | Sway-Tin |
| 5,101,322 | A | 3/1992 | Ghaem et al. |
| 5,235,491 | A | 8/1993 | Weiss |
| 5,272,599 | A | 12/1993 | Koenen |
| 5,295,044 | A | 3/1994 | Araki et al. |
| 5,365,403 | A | 11/1994 | Vinciarelli et al. |
| 5,536,677 | A | 7/1996 | Hubacher |
| 5,838,554 | A | 11/1998 | Lanni |
| 5,872,051 | A | 2/1999 | Fallon et al. |
| 5,873,512 | A | 2/1999 | Bielick et al. |
| 5,920,458 | A | 7/1999 | Azar |
| 5,933,324 | A | 8/1999 | Barrett |
| 6,189,771 | B1 | 2/2001 | Maeda et al. |
| 6,243,269 | B1 | 6/2001 | Dibene, II et al. |
| 6,245,595 | B1 | 6/2001 | Nguyen et al. |
| 6,272,015 | B1 | 8/2001 | Mangtani |

(Continued)

*Primary Examiner* — Luan C Thai
(74) *Attorney, Agent, or Firm* — Haverstock & Owens LLP (57) ABSTRACT

Methods of and devices for providing escaping routes for the flux and gases generated to move away from the solder joint in the process of solder joint formation.

20 Claims, 6 Drawing Sheets

(56) References Cited

U.S. PATENT DOCUMENTS

| | | | |
|---|---|---|---|
| 6,282,092 B1 | 8/2001 | Okamoto et al. | |
| 6,311,139 B1 | 10/2001 | Kuroda et al. | |
| 6,369,328 B1 | 4/2002 | Munakata | |
| 6,549,409 B1 | 4/2003 | Saxelby et al. | |
| 6,775,162 B2 | 8/2004 | Mihai et al. | |
| 6,795,315 B1 | 9/2004 | Wu et al. | |
| 6,838,309 B1* | 1/2005 | McCann | 438/106 |
| 7,208,833 B2 | 4/2007 | Nobori et al. | |
| 7,215,020 B2* | 5/2007 | Nakase et al. | 257/706 |
| 7,676,775 B2 | 3/2010 | Chen et al. | |
| 8,004,069 B2* | 8/2011 | Bauer et al. | 257/666 |
| 8,338,236 B1* | 12/2012 | Low | 438/127 |
| 8,456,023 B2* | 6/2013 | Bauer et al. | 257/779 |
| 8,466,548 B2* | 6/2013 | Bayerer et al. | 257/703 |
| 8,707,221 B2 | 4/2014 | Durkan | |
| 8,718,720 B1* | 5/2014 | Liu et al. | 455/575.1 |
| 2001/0003427 A1 | 6/2001 | Ferguson et al. | |
| 2001/0018263 A1 | 8/2001 | Ochiai et al. | |
| 2001/0045297 A1 | 11/2001 | Miller et al. | |
| 2002/0008963 A1 | 1/2002 | DiBene, II et al. | |
| 2002/0092160 A1 | 7/2002 | McCullough | |
| 2004/0122606 A1 | 6/2004 | Cohen et al. | |
| 2004/0144527 A1 | 7/2004 | Yang et al. | |
| 2005/0246590 A1 | 11/2005 | Lancaster | |
| 2006/0196642 A1 | 9/2006 | Gharib | |
| 2007/0198548 A1 | 8/2007 | Lee | |
| 2007/0273011 A1 | 11/2007 | Singleton et al. | |
| 2008/0217768 A1 | 9/2008 | Miranda et al. | |
| 2008/0224026 A1 | 9/2008 | Pasternak | |
| 2008/0301597 A1 | 12/2008 | Chen et al. | |
| 2009/0014501 A1 | 1/2009 | Nishi et al. | |
| 2009/0166890 A1* | 7/2009 | Chrysler et al. | 257/778 |
| 2009/0265155 A1 | 10/2009 | Yokogawa | |
| 2011/0307752 A1 | 12/2011 | Fujil et al. | |

* cited by examiner

ESCAPE ROUTES

CROSS-REFERENCE TO RELATED APPLICATION(S)

This application claims priority under 35 U.S.C. §119(e) of the U.S. Provisional Patent Application Ser. No. 61/772,978, filed Mar. 5, 2013 and titled, "ESCAPE ROUTES," is hereby incorporated by reference in its entirety for all purposes.

FIELD OF THE INVENTION

The present invention relates to semiconductors. More specifically, the present invention relates to semiconductor assembly.

BACKGROUND OF THE INVENTION

With the popularity of the computers and the consumers' electronics, various electronic gadgets are becoming a necessity in our daily life. The electronic gadgets contain IC (integrated circuits) chips, such as bottom terminal components (BTC). BTC is getting more and more popular with its high connectivity speed. However, void issues at the central ground pads are problems for the BTC and other computer chips that are attached to printed circuit boards (PCB). For example, a quad flat no-leads package (QFN) from automotive industry has a HiP (Head in Pillow) phenomenon with an occurrence of 90% of field failure in one pin connector, which generally result from the void issues.

Typically, flux is trapped underneath the bottom internal components among other SMT (surface-mount technology) parts in the reflowing process (e.g., SMT soldering). The amount of flux in the paste is around 11% of the total paste amount (in weight). Sometimes, the amount of flux applied is too much and the gases generated in the soldering process are often trapped underneath the components and pads affecting the reliability of the soldering joints. Voids generated by the excess flux and the gases affect mechanical properties and reduce the integrity of the solder joint. Some experiments show that the components and/or computer chips can be lifted by the gases close to 4 mils, which can stress the solder joint in formation between the components and the signal pins.

Figure 1:
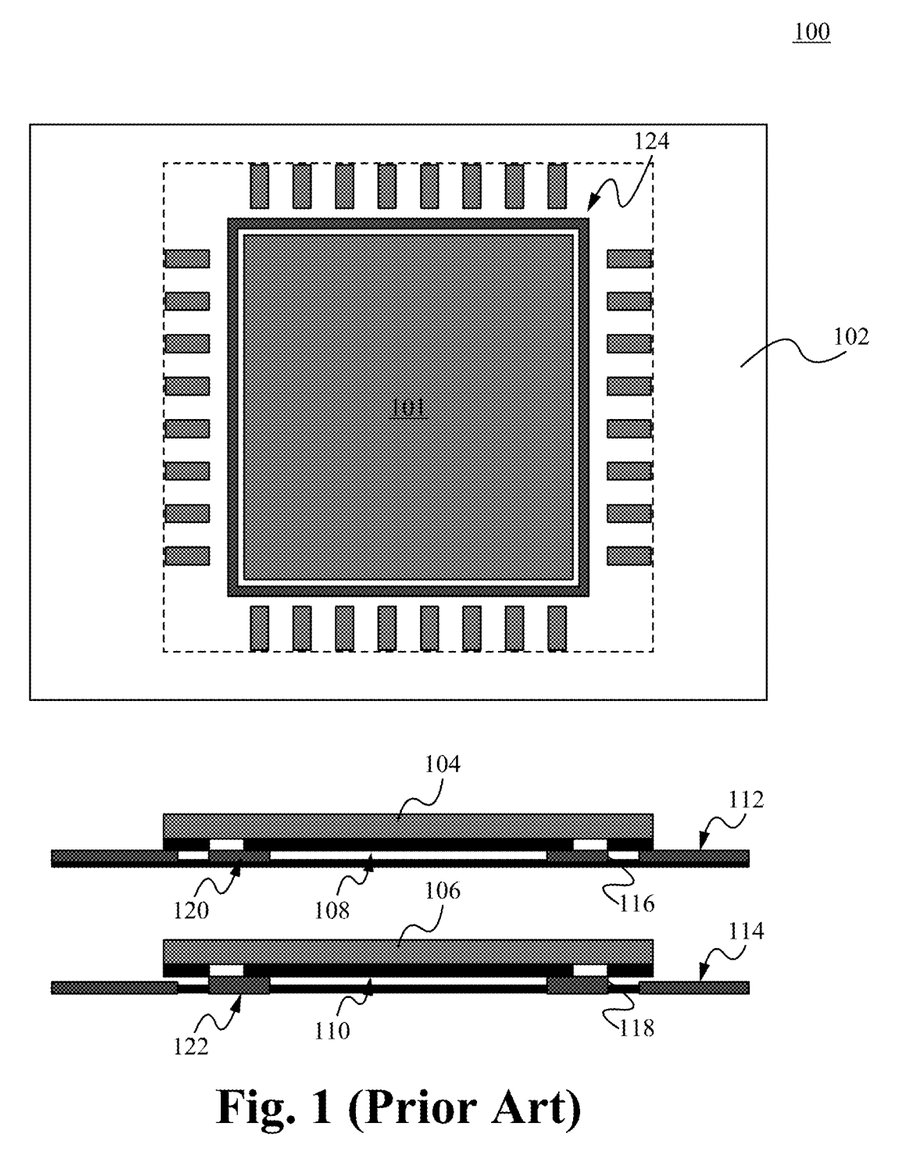
FIG. 1 illustrates a typical semiconductor assembly.

FIG. 1 illustrates a typical semiconductor assembly having a BTC 101 on a PCB 102. In a typical PCB of SMD pad (solder mask defined) 112 and a NSMD pad (non solder mask defined) 114, flux starts to move and evaporate after the paste reaching 183° C. in a soldering process. The flux entrapped underneath the BTC evaporates and generates gases when heat increases. The flux and the gases try to find a way out. However, the resin seal the external edges (between the solder mask damp 120, 122, 116, and 118 (collectively solder mask damp 124) and the bottom side of the BTC devices 104 and 106) forming a confirmed space 108 and 110. When the gases increase in volume, the devices 104 and 106 are lifted by the gases. In some cases, the devices 104 and 106 can be lifted close to 4 mils, which cause stress to the solder joint in formation between the components and the signal pins. The flux movement starts to decrease as soon as the temperature goes down.

SUMMARY OF THE INVENTION

Methods of and devices for reducing/avoiding voids between the electronic chips and the PCB boards and reducing the connection stresses are provided. The methods and devices include providing escaping routes for the flux and gases generated to move away from the solder joint in the process of solder joint formation.

In an aspect, a device comprises a computing chip physically coupled with a printed circuit board and a fluid channel coupled with the computing chip, the printed circuit board, or a combination thereof allowing a fluid to come out. In some embodiments, the fluid comprises flux. In other embodiments, the fluid comprises an amount of gas. In other embodiments, the fluid is generated when a heat is applied. In some other embodiments, the heat is applied at a reflow process. In some embodiments, the fluid channel comprises a pressure relief mechanism. In some other embodiments, the computing chip comprises a bottom terminal component.

In another aspect, a semiconductor assembly comprises a fluidic pressure relief structure. In some embodiments, the structure comprises one or more fluid channels. In other embodiments, the one or more fluid channels are at a corner of the semiconductor assembly. In some other embodiments, the one or more fluid channels are at a side of the semiconductor assembly. In some embodiments, the assembly comprises dual flat no-lead (DFN), land grid array (LGA), or pull-back quad flat no-lead (PQFN). In other embodiments, the fluidic pressure is generated when a heat is applied. In some other embodiments, the heat comprises a reflow process. In some embodiments, the fluidic pressure is generated by an amount of gas within the assembly. In other embodiments, the fluidic pressure is generated by an amount of flux within the assembly.

In another aspect, a method of preventing pressure building up in a semiconductor packaging comprises providing one or more aperture in the semiconductor packaging and allowing a fluid to be released when a heat is applied. In some embodiments, the aperture comprises a channel. In other embodiments, the fluid comprises a flux. In some other embodiments, the fluid comprises an amount of gas.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals are vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 2:
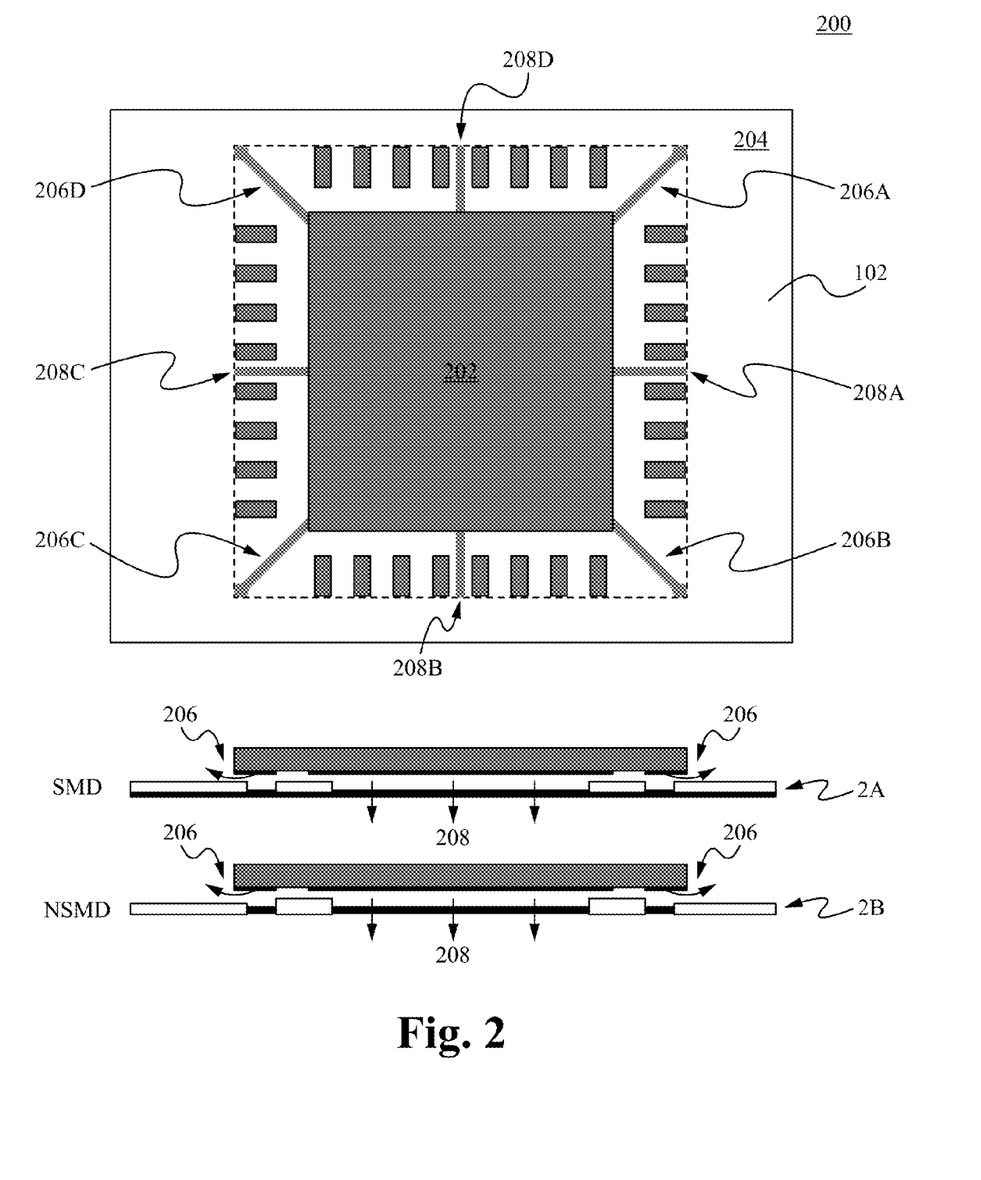
FIG. 2 illustrates a device with escaping routes in accordance with some embodiments of the present invention.

FIG. 2 illustrates a device 200 with escaping routes in accordance with some embodiments of the present invention. A PCB 204 comprises corner escaping routes 206 and side escaping routes 208. The corner escaping routes 206 can be a right top escaping route 206A, a right bottom escaping route 206B, a left top escaping route 206D, and a left bottom escaping route 206C. The side escaping routes comprises routes 208A-208D at the four sides of a computer chip 202 respectively. 2A is a side view of a SMD and 2B is a side view of a NSMD.

Figure 3:
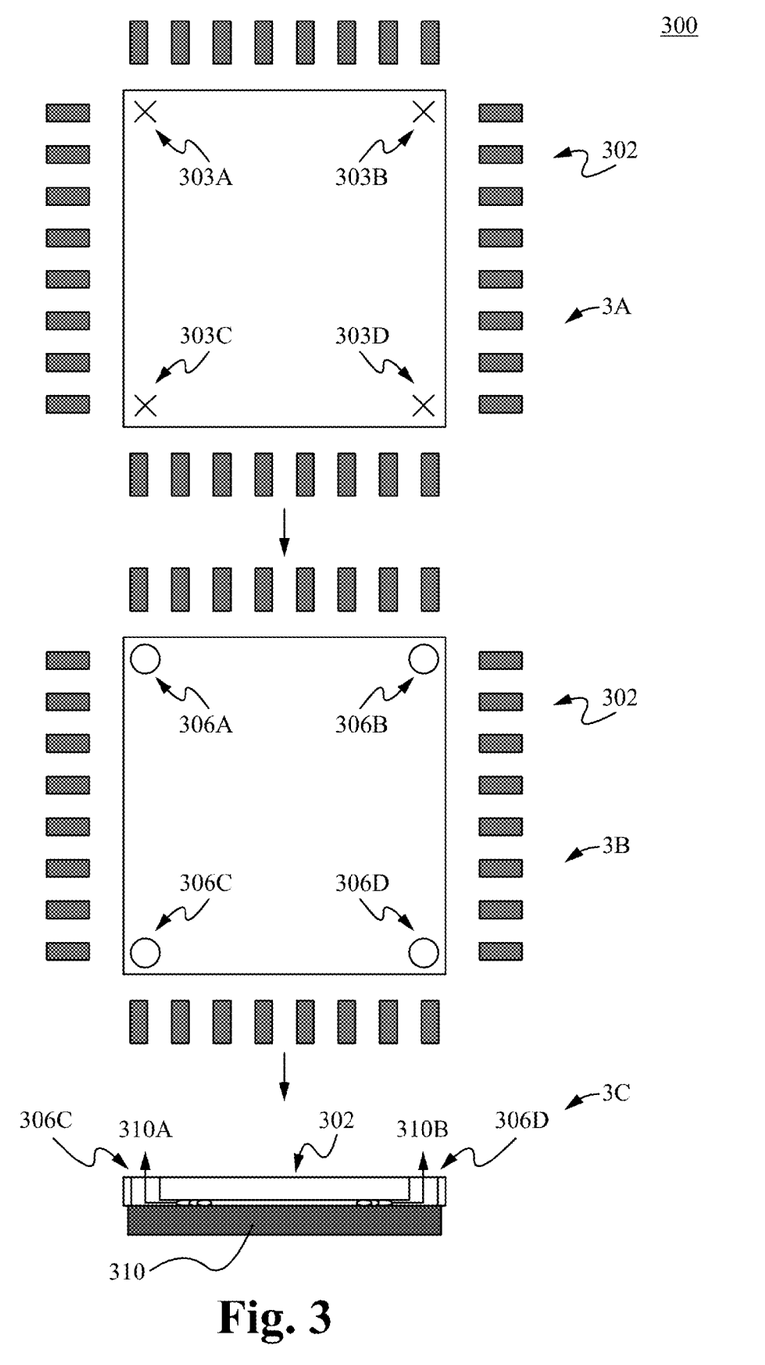
FIG. 3 illustrates a manufacturing process for making a flux and gases escaping aperture in accordance with some embodiments of the present invention.

FIG. 3 illustrates a manufacturing process 300 for making a flux and gases escaping aperture in accordance with some embodiments of the present invention. The process 300 can start at Step 3A by marking and/or labeling pre-drilling holes 303A-303D on an IC chip 302. The pre-drilling holes 303A-303D are determined by factors including the locations that do not affect the electrical signal performances of the IC, locations allowing the flux and/or gases generated to escape, thermal expansion, and heat dissipation. At Step 3B, tools are used to drill holes on the marked pre-drill holes 303A-303D forming escaping apertures 306A-306D. The tool used can be laser, saw, or any other mechanical and/or photo, thermal tools that can be used to drill holes. At Step 3C, the IC chip 302 can be soldered on a PCB board 310. The excess flux and gases generated during the heating process, are able to escape from the escaping apertures 306A-306D forming escaped flux and/or gases 310A and 310B. A person of ordinary skill in the art appreciates that the escaping apertures can be located on the IC chip, so long as the holes do not affect the performance of the IC chips. In some embodiments, the escaping apertures are located at the four corners of the IC chip. In other embodiments, the escaping apertures are located at the center of the IC chip. In some embodiments, the escaping apertures can be incorporated in the process of forming the IC chip, such that additional drilling process is able to be avoided.

Figure 4:
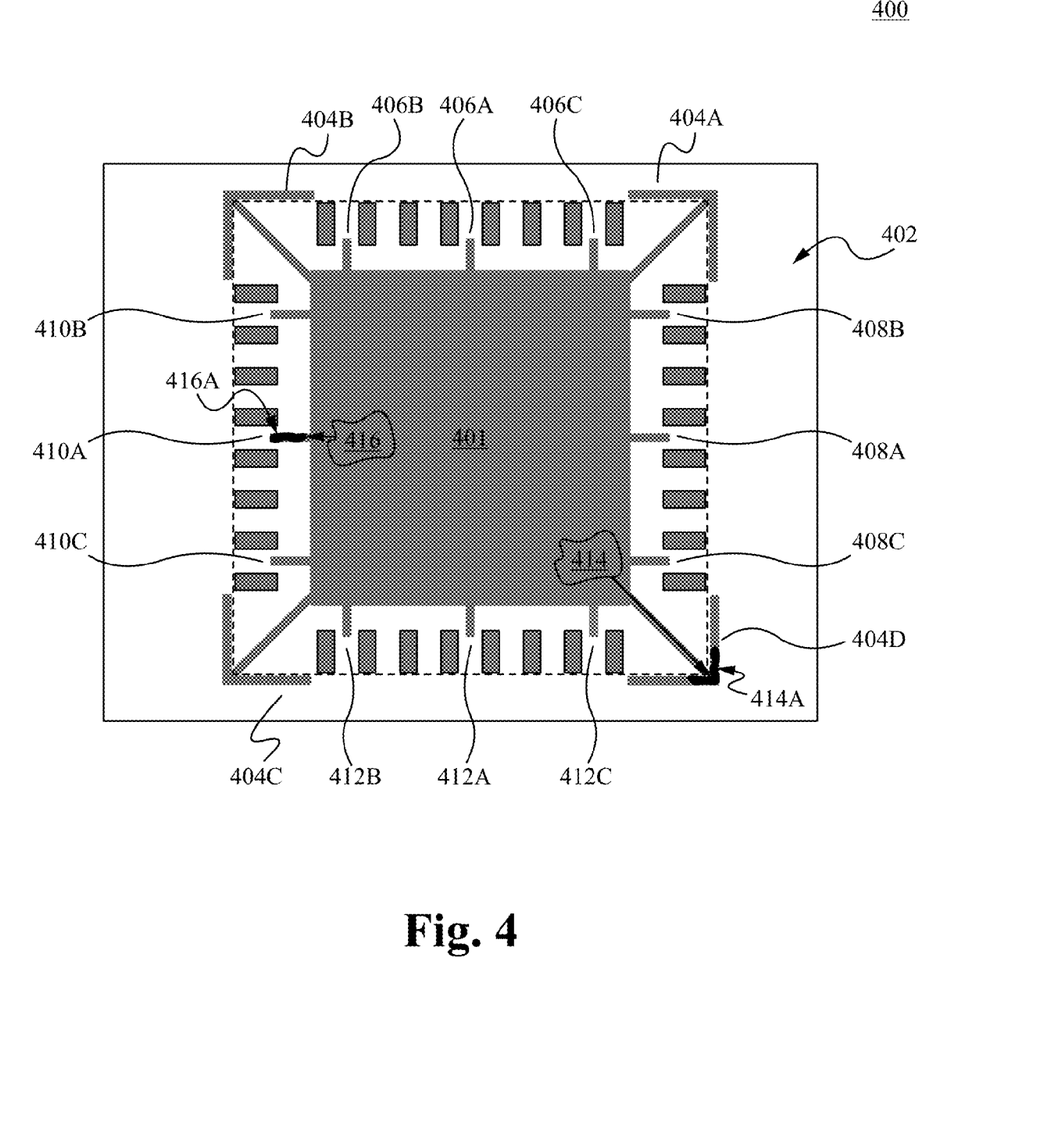
FIG. 4 illustrates escaping route structures in accordance with some embodiments of the present invention.

FIG. 4 illustrates escaping route structures 400 in accordance with some embodiments of the present invention. The structure 400 has a chip 401 with flux and gases escaping routes/channels allowing the flux out-gases to move away from underneath the chip 401. As shown, the chip 401 comprises corner escaping routes 404A, 404B, 404C, and 404D. Top and bottom routes are able to be included, such as 406A-406C and 412A-412C. In some embodiments, the side routes are included, such as 410A-410C and 408A-408C. In some embodiments, the flux and gases escaping routes/channels can have a diameter in 0.1-1 mm. In other embodiments, the flux and gases escaping routes/channels can be in a size allowing the gases/flux to come out. In some embodiments, the flux and gases escaping routes/channels are formed by making the channels on the PCB board. In some embodiments, the flux and gases escaping routes/channels are formed by drilling/making apertures on the IC chips. In other embodiments, the flux and gases escaping routes/channels are formed by elevating a portion of the structure of the IC chips. As illustrated, an amount of gases 414 generated can be removed and come out from the corner channel 404D becoming the removed gas 414A. The flux 416 comes out from the side channel 410A and becoming the removed flux 416A.

Figure 5:
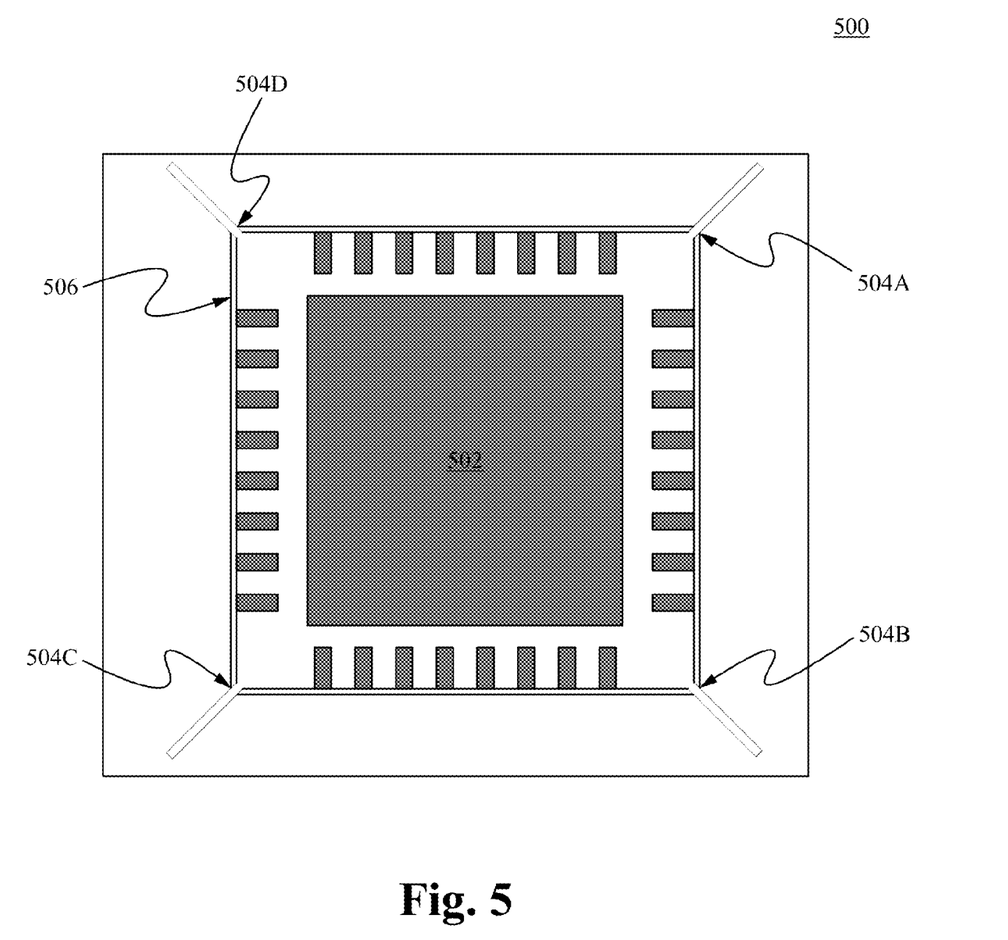
FIG. 5 illustrates another escaping route structure in accordance with some embodiments of the present invention.

FIG. 5 illustrates another escaping route structure 500 in accordance with some embodiments of the present invention. The solder mask damps 506 at the corners on a PCB 502 are removed from a NSMD (non solder mask defined) pad forming the escaping channels 504A-504D. The present invention is also able to be applied on the SMD (solder mask defined) pad. In the following, improvements to the PCB design are incorporated including having blind vias covered, removing solder mask damp between central pads, adding four corner pads, having signal pads with same length, having traces with appropriate neck restriction, and having balanced Cu along the board and breakaways.

Figure 6:
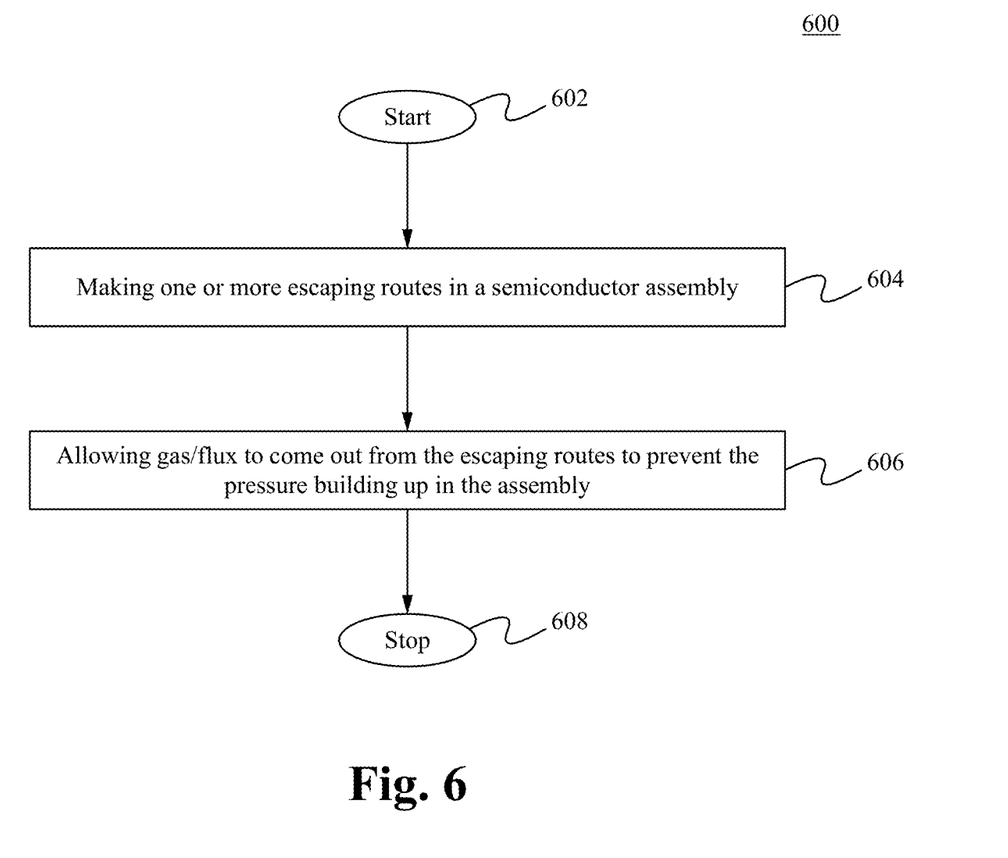
FIG. 6 is a flow chart illustrating a method 600 of preventing pressure building up in a semiconductor packaging in accordance with some embodiments of the present invention.

FIG. 6 is a flow chart illustrating a method 600 of preventing pressure building up in a semiconductor packaging in accordance with some embodiments of the present invention. The method 600 can start from Step 602. At Step 604, one or more escaping routes in a semiconductor assembly are made. The escaping routes can be strategically placed at the predetermined locations on the assembly so long as the flux and gases generated can be released when a heat is applied. At Step 606, gas/flux is allowed to coming out from the escaping routes to prevent the pressure building up in the assembly. The method 600 can stop at Step 608.

The device made with the escaping channels shows that the central void is eliminated and less stress over the joint in the formation of the signal pins by having less movement in the x, y, and z axis. Enclosed gas/flux escaping spaces and elastic materials in chambers allowing the gas/flux to flow and reduce its pressure when heat is applied are within the scope of the present invention.

The escaping channels can be utilized to reduce the stress caused by the flux and/or gases generated when a heat is applied. In operation, the escaping channels are placed at the predetermined locations, such that the gases/flux can be removed via these channels without interfering the performance of the computer chip and PCB board.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A device comprising:
   a. a computing chip physically coupled with a printed circuit board; and
   b. a first fluid channel on a body of the computing chip coupled with a second fluid channel on the printed circuit board forming a connected fluid channel allowing a fluid to come out from a space beneath the computer chip to the printed circuit board.

2. The device of claim 1, wherein the fluid comprises flux.

3. The device of claim 1, wherein the fluid comprises an amount of gas.

4. The device of claim 1, wherein the fluid is generated when a heat is applied.

5. The device of claim 1, wherein the heat is applied at a reflow process.

6. The device of claim 1, wherein the fluid channel comprises a pressure relief mechanism.

7. The device of claim 1, wherein the computing chip comprises a bottom terminal component.

8. A semiconductor assembly comprising a first fluidic pressure relief structure on a body of a printed circuit board fluidically coupling with a second fluidic pressure relief structure on a body of the computing chip allowing a fluid to come out from a space beneath a computer chip to the printed circuit board.

9. The assembly of claim 8, wherein the structure comprises one or more fluid channels.

10. The assembly of claim 8, wherein the one or more fluid channels are at a corner of the semiconductor assembly.

11. The assembly of claim 8, wherein the one or more fluid channels are at a side of the semiconductor assembly.

12. The assembly of claim 8, wherein the assembly comprises dual flat no-lead (DFN), land grid array (LGA), or pull-back quad flat no-lead (PQFN).

13. The assembly of claim 8, wherein the fluidic pressure is generated when a heat is applied.

14. The assembly of claim 13, wherein the heat comprises a reflow process.

15. The assembly of claim 8, wherein the fluidic pressure is generated by an amount of gas within the assembly.

16. The assembly of claim 8, wherein the fluidic pressure is generated by an amount of flux within the assembly.

17. A method of preventing pressure building up in a semiconductor packaging comprising:
  a. providing one or more aperture in the semiconductor chip;
  b. providing a pressure relief structure on a printed circuit board coupling with the one or more aperture in the semiconductor chip; and
  c. allowing a fluid to be released from the one or more aperture in the semiconductor chip to the pressure relief structure on the printed circuit board when a heat is applied.

18. The method of claim 17, wherein the aperture comprises a channel.

19. The method of claim 17, wherein the fluid comprises a flux.

20. The method of claim 17, wherein the fluid comprises an amount of gas.

* * * * *